United States Patent
Felmlee

(10) Patent No.: US 9,519,037 B2
(45) Date of Patent: Dec. 13, 2016

(54) SPATIALLY COINCIDENT MRI RECEIVER COILS AND METHOD FOR MANUFACTURING

(71) Applicant: Joel P. Felmlee, Rochester, MN (US)

(72) Inventor: Joel P. Felmlee, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 884 days.

(21) Appl. No.: 13/674,654

(22) Filed: Nov. 12, 2012

(65) Prior Publication Data

US 2013/0119987 A1 May 16, 2013

Related U.S. Application Data

(60) Provisional application No. 61/558,100, filed on Nov. 10, 2011.

(51) Int. Cl.
*G01V 3/00* (2006.01)
*G01R 33/34* (2006.01)
*G01R 33/341* (2006.01)
*G01R 33/3415* (2006.01)

(52) U.S. Cl.
CPC ....... *G01R 33/34092* (2013.01); *G01R 33/341* (2013.01); *G01R 33/3415* (2013.01); *G01R 33/34007* (2013.01)

(58) Field of Classification Search
CPC .............................................. G01R 33/34092
USPC ....................................................... 324/322
See application file for complete search history.

(56) References Cited

U.S. PATENT DOCUMENTS

| | | | |
|---|---|---|---|
| 2,755,466 A | 7/1956 | Klancnik, Jr. | |
| 4,605,899 A | 8/1986 | Eumurian et al. | |
| 4,621,237 A * | 11/1986 | Timms | 324/322 |
| 4,733,190 A * | 3/1988 | Dembinski | 324/318 |
| 4,816,765 A * | 3/1989 | Boskamp | 324/318 |
| 5,196,796 A * | 3/1993 | Misic et al. | 324/322 |
| 5,243,289 A * | 9/1993 | Blum et al. | 324/322 |

(Continued)

FOREIGN PATENT DOCUMENTS

| | | |
|---|---|---|
| WO | 9613735 A1 | 5/1996 |
| WO | 9727645 A1 | 7/1997 |
| WO | 2010013992 A1 | 2/2010 |

OTHER PUBLICATIONS

Armenta, et al., Efficient Evaluation of the Terminal Response of a Twisted-Wire Pair Excited by a Plane-Wave Electromagnetic Field, IEEE Transactions on Electromagnetic Compatibility, 2007, 49(3):698-707.

(Continued)

*Primary Examiner* — Rodney Fuller
(74) *Attorney, Agent, or Firm* — Quarles & Brady, LLP

(57) ABSTRACT

A magnetic resonance imaging receiver coil provides for high SNR and high uniformity over a range of loading conditions with layers, or stacks, of independent conductive elements. The plurality of layers preload the receiver coil reducing the circuit variation as the subject coupling and loading varies. The preload is such that coil performance, or SNR, is maintained over a large range of impedance variation. This configuration is designed to exceed the performance of single trace coils over a range of impedance consistent with variations associated with different subjects, and may also incorporate coils of different resonance frequencies.

9 Claims, 5 Drawing Sheets

(56) References Cited

U.S. PATENT DOCUMENTS

| | | | |
|---|---|---|---|
| 5,315,251 A | 5/1994 | Derby | |
| 5,317,266 A * | 5/1994 | Meissner | 324/318 |
| 5,386,191 A * | 1/1995 | McCarten et al. | 324/318 |
| 5,471,142 A * | 11/1995 | Wang | 324/318 |
| 5,483,159 A * | 1/1996 | Van Heelsbergen | 324/318 |
| 5,575,287 A | 11/1996 | Eydelman | |
| 5,585,721 A * | 12/1996 | Datsikas | 324/318 |
| 5,592,088 A * | 1/1997 | Matsunaga et al. | 324/318 |
| 6,351,124 B1 * | 2/2002 | Vester et al. | 324/318 |
| 6,400,154 B2 * | 6/2002 | Tomanek et al. | 324/318 |
| 6,600,451 B2 | 7/2003 | Mimura et al. | |
| 6,822,614 B2 | 11/2004 | Chiu | |
| 7,081,753 B2 | 7/2006 | Mullen et al. | |
| 7,205,947 B2 | 4/2007 | Parsche | |
| 7,573,432 B1 | 8/2009 | Eydelman et al. | |
| 7,579,835 B2 | 8/2009 | Schnell et al. | |
| 7,579,836 B2 | 8/2009 | Schnell et al. | |
| 7,619,416 B2 | 11/2009 | Nordmeyer-Massner et al. | |
| 8,193,810 B2 * | 6/2012 | Otake et al. | 324/318 |
| 2002/0013526 A1 * | 1/2002 | Su et al. | 600/422 |
| 2003/0020476 A1 * | 1/2003 | Duensing | 324/318 |
| 2004/0217761 A1 * | 11/2004 | Wong et al. | 324/318 |
| 2004/0251902 A1 * | 12/2004 | Takagi et al. | 324/318 |
| 2006/0119360 A1 * | 6/2006 | Yamamoto et al. | 324/318 |
| 2006/0220648 A1 * | 10/2006 | Pappas | 324/322 |
| 2008/0204021 A1 | 8/2008 | Leussler et al. | |
| 2009/0118611 A1 | 5/2009 | He | |
| 2010/0033178 A1 | 2/2010 | Lee et al. | |
| 2011/0121830 A1 * | 5/2011 | Ma et al. | 324/318 |
| 2012/0182015 A1 * | 7/2012 | Driemel et al. | 324/322 |

OTHER PUBLICATIONS

Bidinosti, et al., Active Shielding of Cylindrical Saddle-Shaped Coils: Application to Wire-Wound RF Coils for Very Low Field NMR and MRI, Journal of Magnetic Resonance, 2005, 177:31-43.

Froncisz, et al., Q-Band Loop-Gap Resonator, Review of Scientific Instruments, 1986, 57(6):1095-1099.

McDermott, et al., Microtesla MRI with a Superconducting Quantum Interference Device, PNAS, 2004, 101(21):7857-7861.

Nnewihe, et al., 16-Channel Custom-Fitted Bilateral Breast Coil for Parallel Imaging in Two Directions, ISMRM, 2010, 1 page.

Stolle, Electromagnetic Coupling of Twisted Pair Cables, IEEE Jouranl on Selected Areas in Communications, 2002, 20(5):883-892.

* cited by examiner

SPATIALLY COINCIDENT MRI RECEIVER COILS AND METHOD FOR MANUFACTURING

CROSS-REFERENCE TO RELATED APPLICATIONS

This application claims the benefit of U.S. Provisional patent application Ser. No. 61/558,100 filed on Nov. 10, 2011 and entitled "Spatially Coincident MRI Receiver Coils and Method for Manufacturing".

BACKGROUND OF THE INVENTION

The present invention generally relates to radio frequency (RF) receiver coils for magnetic resonance applications.

Magnetic resonance imaging (MRI) detects the faint nuclear magnetic resonance (NMR) signals given off by protons or other nuclei in the presence of a strong magnetic field after excitation with a RF signal. The NMR signals are detected using loop antennas termed "coils" or resonators.

Coils for magnetic resonance applications are typically operated at the Larmor frequency. The Larmor frequency depends on the strength of the basic magnetic field of the magnetic resonance system and on the chemical element whose excited spin is being detected. For hydrogen (which is the most frequent case), the gyromagnetic ratio is approximately 42.57 MHz/Tesla (1 Tesla=10000 gaus). During operation of a coil at resonance, a current oscillates with a resonance frequency in the conductor element. This current is particularly high when the conductor element is tuned to the resonance frequency. Thus, in the ideal case, the Larmor frequency corresponds to the resonance frequency of the resonator or coil.

NMR signals are, relatively speaking, extremely faint and therefore "local coils" or "surface coils" may be designed to be placed in close proximity to the region of interest of the imaged object. The size of the local coils is kept small to allow them to be easily fit to the patient on the MRI patient table. Importantly, the small area of loops of the local coil provides improved signal strength relative to received noise. The local coils are in contrast to the whole body coil typically present in an MRI machine and useful for obtaining broad survey scans of the patient.

The small size of a local coil generally limits the volume over which the coil is sensitive. For imaging large areas of the body, for example, neurovascular imaging of the head, neck, and lower spine, the whole body coil with its lower signal to noise ratio (SNR) must be used. Alternatively, coverage of this region can be obtained by using several local coils, taking multiple images of the patient and changing or repositioning the local coil in between images. This latter approach is time consuming and impractical in many situations. Additionally, these approaches may still suffer from lower SNR than is desired for imaging.

Mutli-layer conductors fashioned as resonators or coils for magnetic resonance imaging are also known, and examples include U.S. Pat. Nos. 7,579,835 and 7,579,836. However, as with single element coils, the use of multi-layer conductors in an MR coil does not, in itself, lead to improvements in SNR and uniformity over a range of clinically relevant loading conditions. In addition, when attempting to maintain SNR between subjects that present different loading conditions, a single coil would need to be re-tuned for each subject, or a number of single coils that were each tuned to different loading conditions would be needed. Alternatively, a broadband coil could be used to provide greater uniformity across loading conditions, but these broadband coils suffer from substantially lower SNR than could be achieved with single coils.

SUMMARY OF THE INVENTION

The present invention is directed generally to a coil for magnetic resonance applications that includes layers, or stacks, of independent conductive elements to provide high SNR and high uniformity. The additional layers in the stacked coil configuration achieve greater SNR and uniformity than a single layer of the same type could achieve on its own; especially when the variable loading conditions routinely found in clinical imaging are considered.

To this end, a coil, is provided that includes a conductor formed to have multiple layers that are electrically insulated from each other. The conductor is designed so that, during operation of the conductor at the resonance frequency, the layers inductively couple to one another causing a condition of "pre-loading," which causes the resultant coil to be less sensitive to loading due to variability among subjects or positioning of the coil. This inductive coupling is controlled by selectively spacing the layers apart from one another, and appropriately tuning each conductor element to a resonance frequency. If there is too much inductive coupling between the layers, then there will be no coupling to the subject and no image can be formed. The amount of coupling between the layers determines the initial impedance pre-loading that moderates the coil element performance over a changing load. This means that stacked coil elements will perform at higher SNR, when used on different subjects of different sizes, or biochemistry, than a single element coil under the same conditions.

DETAILED DESCRIPTION OF THE INVENTION

Figure 1:
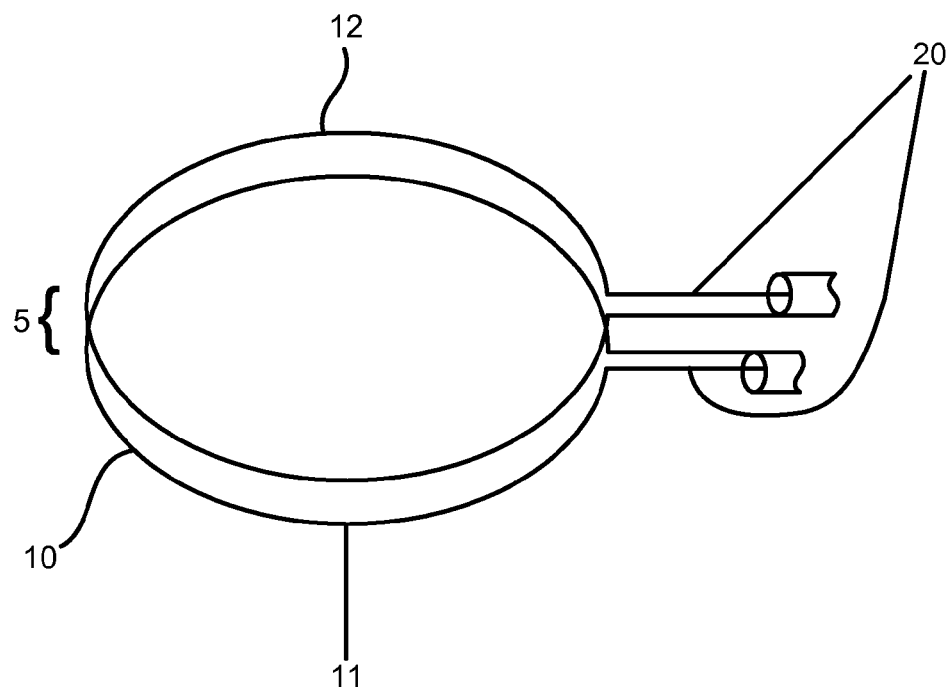
FIG. 1 is a perspective view of a basic stacked coil magnetic resonator architecture according to one configuration of the present invention, showing two distinct elements with a separation distance between them.

Referring to FIG. 1, a coil 10 is shown as two wires in a stacked coil arrangement that can include a first conductor element 11 and a second conductor element 12 located a distance above the first conductor element 11 as denoted by a separation distance 5. Both conductor elements 11, 12 in this configuration can have a substantially similar field of view (FOV) of a subject. When a time varying external magnetic field penetrates the coil 10 normal to the surface surrounded by the loop, a small time varying current is induced in the coil 10. The current induces a voltage that is output to a coaxial cable 20 that carries the voltage signal to a signal processing unit (not shown). This signal processing unit can combine the signals from both conductor elements 11, 12, or can retain separate signals for each element. Similarly, the conductor elements 11, 12 can be tied together proximal to the coil 10, rather than requiring additional coaxial cables 20 to the signal processing unit.

The configuration of FIG. 1 can be incorporated into a printed circuit board (PCB) where the loops of the wire conductor elements 11, 12 depicted in FIG. 1 may take on the form of traces printed onto a dielectric substrate. By placing the trace for conductor element 11 on one side of the PCB, and the trace for conductor element 12 on the opposite side of the PCB, the PCB thickness itself may be used for the separation distance 5. This configuration carries the advantage of easy and rapid mass manufacturing. The PCB may also be a multi-layered board, whereby the separation distance 5 may be dependent upon which layers in the board contain traces for the conductor elements. Additionally, this multi-layer configuration allows for stacking of a plurality of conductor elements greater than two as depicted in FIG. 1.

The separation distance 5 of FIG. 1 may be selected based upon the field strength and resonant frequency of the MR scanner being utilized. For example, for a 3 T MR scanner, a separation distance 5 of thirty mils may be used; and for a 1.5 T scanner a negligible separation distance 5 may be used as in the configuration of FIGS. 2a and 2b described below. Depending upon variations in MR scanners, PCB tolerances, PCB material dielectric constants, and the like, there may be ranges of separation distance 5 values that are desirable for a particular application, or that may provide the best SNR, or that may allow for appropriate inductive coupling without being so great as to allow for capacitive coupling. Such ranges may include 0-10 mils for 1.5 T, and 10-45 mils for 3 T. The width of the trace or gauge of the wire may also influence the desired separation distance 5, since a larger trace or wire will be able to handle greater induced currents and have greater surface area exposed to the magnetic field. Higher Tesla MR scanners may require greater separation distances.

Figure 2A:
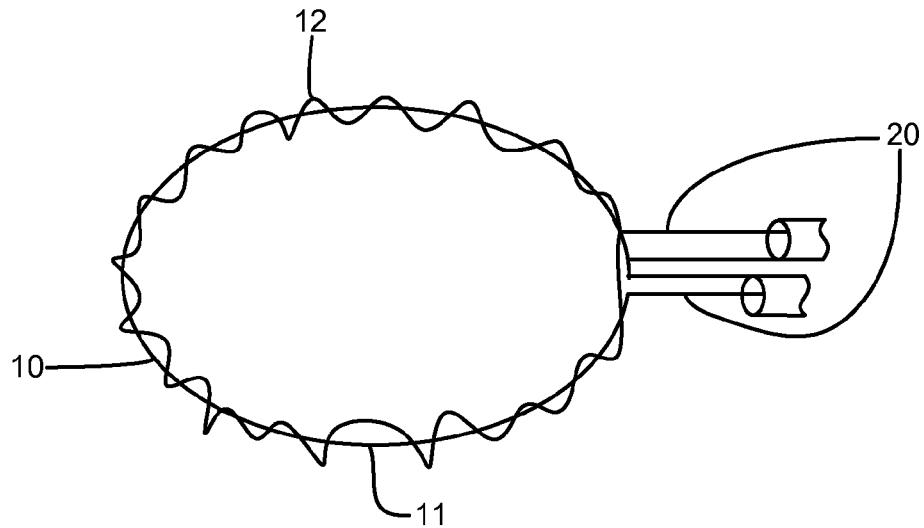
FIG. 2a is a perspective view of a multi-layer coil with twisted conductor elements in accordance with the present invention.

Referring now to FIG. 2a, another configuration for the coil 10 is shown where the second conductor element 12 is now twisted or wound around the first conductor element 11. This configuration provides both conductor elements 11,12 with a substantially similar FOV of a subject, and increases inductive coupling between the conductor elements 11, 12. Alternate configurations include braiding the conductor elements 11, 12 together rather than wrapping one around the other. The coil 10 in this configuration may have any number of N windings or twists, where the number of twists may change with the application (different scanners, different anatomy, and the like) in order to achieve the highest SNR possible.

Figure 2B:
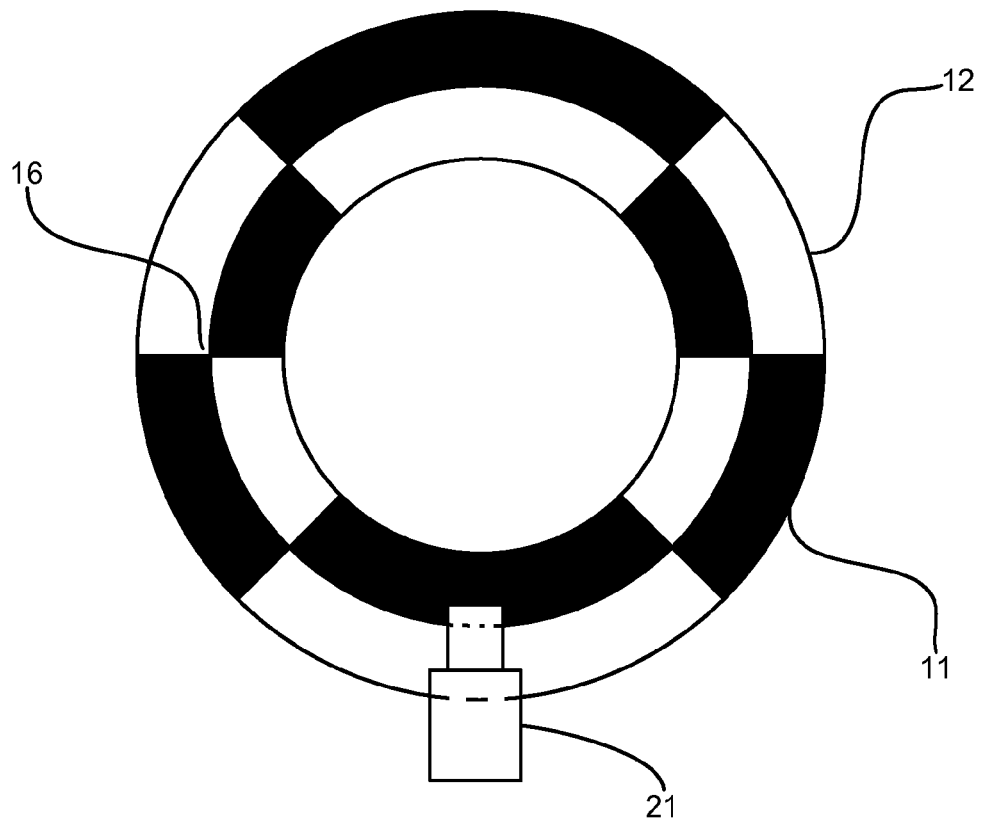
FIG. 2b is a top view of the twisted conductor elements coil from FIG. 2a in the form of traces on a printed circuit board (PCB).

The configuration shown in FIG. 2a may also take the form of traces on a PCB; one example of such a configuration is depicted by the top view of a PCB in FIG. 2b. As can be seen in FIG. 2b, first and second conductor elements 11 and 12 exchange which side of the PCB they are on when they encounter the junctions 16. The first conductor element 11 is denoted by the black traces, while the second conductor element 12 is denoted by the white traces. The junctions 16 may be jumpers, or other forms of suitable electrical bridges, which allow the conductive elements 11 and 12 to continue around the PCB without coming into electrical contact with one another, but also allowing them to function on the same plane, rather than have a vertical separation distance. Blocking networks 21 for conductive elements 11 or 12 may be used to provide electrical contact between the conductive elements 11, 12 and the coaxial cables 20 (as illustrated in FIG. 1) which carry the signal to the processing unit.

Figure 3:
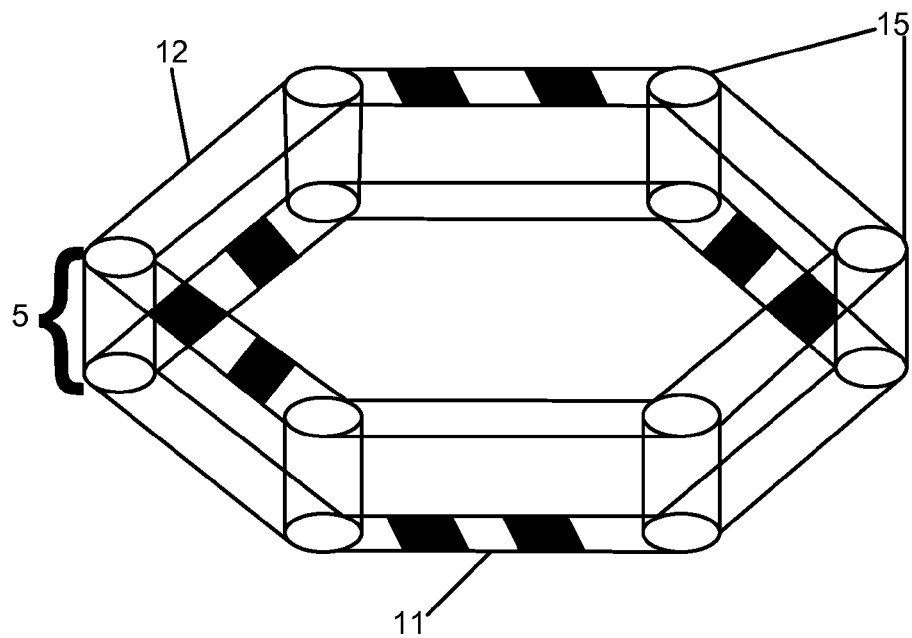
FIG. 3 is a top view of the twisted conductor elements coil from FIG. 2a using vias on a printed circuit board (PCB).

Referring now to FIG. 3, another configuration is depicted for the wound pair of first and second conductor elements 11 and 12 of FIG. 2a. This configuration is in the form of traces on a PCB, but where the traces are on opposite sides of a PCB layer. The first conductor element 11 is denoted by the black striped traces, whereas the second conductor element 12 is denoted by the white traces. The conductor elements 11 and 12 exchange which side of the PCB they are on when they encounter the vias 15. The vias 15 can be designed, or spaced, in order to provide a path from one side of the PCB to another, or between layers in a multi-layer PCB, such that conductor elements 11 and 12 do not come into electrical contact with one another. This configuration allows for the twisted conductor elements to also incorporate the separation distance 5.

It has been found that the coils 10 of the above and following types maintain a higher level of performance over a wider range of load impedance when compared to a single loop coil, as shown in Table 1 below. That is, a single loop coil has a narrower band of SNR performance that rises and falls off rapidly with changes in load impedance (a typical target impedance is 50 ohms). Load impedance helps facilitate the amount of coupling between a coil and a subject. The coil 10 discussed here, having a stacked or twisted configuration, maintains a broader range of SNR performance with changes in load impedance. Since subjects come in all shapes, sizes, densities, and biochemical compositions, changes in load impedance are expected, and may change widely between subjects. A single loop coil that is on resonance, and at peak SNR performance for one subject, may not be at peak performance for another subject. The stacked or twisted configuration of the coil 10 here, will maintain performance closer to the expected peak SNR between a wider range of subjects who offer a broader range of coupling (and load impedance).

Table 1 below shows data where a phantom and coil (either a single or stacked printed circuit board coil) were kept in the same constant configuration, with the coil placed on top of the phantom ("Phantom" loading condition in the table), and various loading containers reflecting different loading conditions (1-4 in the table) were then placed on top of the coil. These different loading conditions (1-4 and phantom only) were used to change the coil circuit impedance which was then measured and recorded in the table. The SNR was measured under each of the loading conditions using the same phantom, coil, and geometry.

TABLE 1

SNR and Load Impedances by Coil

| PCB (coil) | Loading condition | Impedance (Ohms) (phantom + loader) | SNR |
|---|---|---|---|
| Single | 1 | 44 | 87.13 |
|  | 2 | 52 | 96.97 |
|  | 3 | 40 | 105.2 |
|  | 4 | 36 | 81.75 |

TABLE 1-continued

SNR and Load Impedances by Coil

| PCB (coil) | Loading condition | Impedance (Ohms) (phantom + loader) | SNR |
|---|---|---|---|
| Stacked | Phantom | 58 | 124.5 |
| | 1 | 35 | 107.6 |
| | 2 | 38 | 122.6 |
| | 3 | 31 | 102.7 |
| | 4 | 29 | 99.1 |
| | Phantom | 54 | 120.6 |

Figure 6:
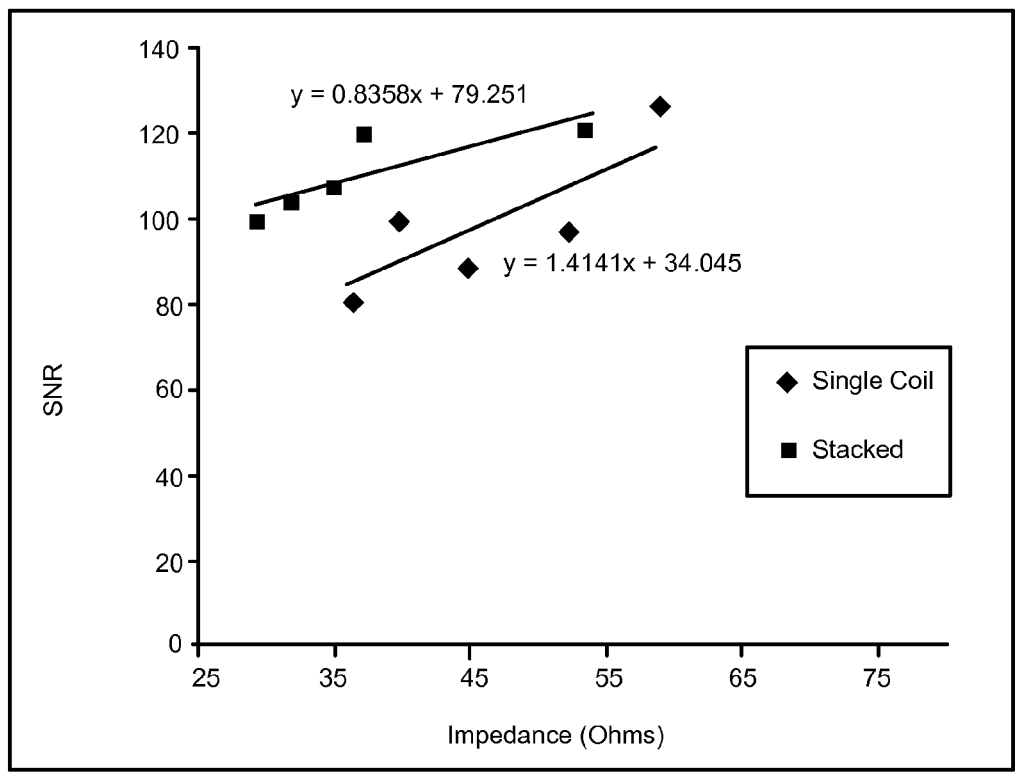
FIG. 6 is a graph showing performance increase of stacked elements in comparison to single element receiver coils over a range of loading conditions.

FIG. 6, a graph of the data from Table 1, shows the SNR as a function of the loading condition (in ohms). FIG. 6 shows the stacked and single coil impedance differences for each loading condition (proton imaging at 1.5 T, 63.86 MHz) and that the stacked coil SNR is significantly higher over the entire impedance range. The linear best fit lines are included to emphasize this point.

Figure 7:
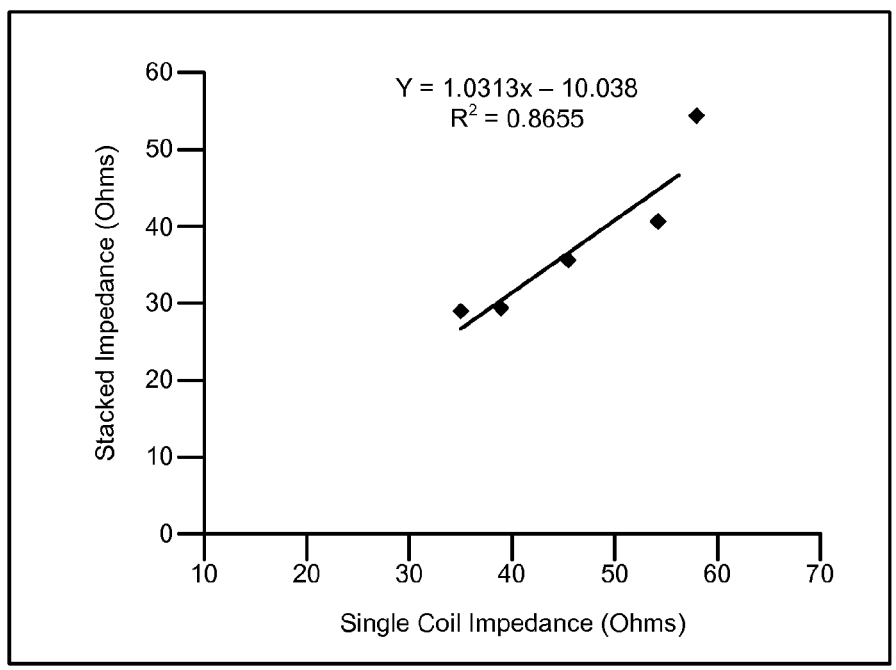
FIG. 7 is a graph showing a measured impedance for stacked and single element coils when exposed to the same loading conditions.

Referring to FIG. 7, a graph of the data from Table 1, shows the stacked coil impedance values as a function of the single coil impedance values. As indicated before, the stacked and single coils were exposed to the same loading conditions for each point on the graph. As indicated by the y-intercept of the best fit line, the stacked impedance is lower for the stacked coil by 10 ohms. This 10 ohm difference represents the pre-load for the stacked coil that is subtracted from impedance that would have occurred in the single coil.

In addition to gains in SNR, the coil configurations of the present invention may be utilized for heteronuclear detection. One conductor element can be tuned to detect a first nuclei, and the second conductor element can be tuned to detect a second nuclei for simultaneous detection of both the first and second nuclei signals. Such nuclei may include 1H, 13C, 31P, 23Na, 19F, and the like. Utilizing an appropriate pulse sequence, the heteronuclear coil system may facilitate chemical analysis that provides for chemical discrimination and characterization of compounds present in the subject.

Figure 4A:
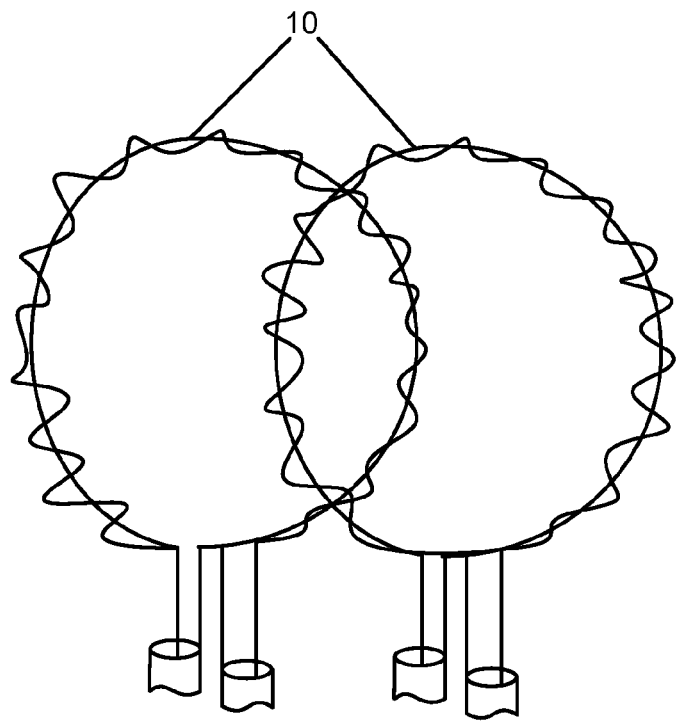
FIGS. 4a and 4b are plan views of one-dimensional and two dimensional array configurations of stacked elements, respectively, in accordance with the present invention.
Figure 4B:
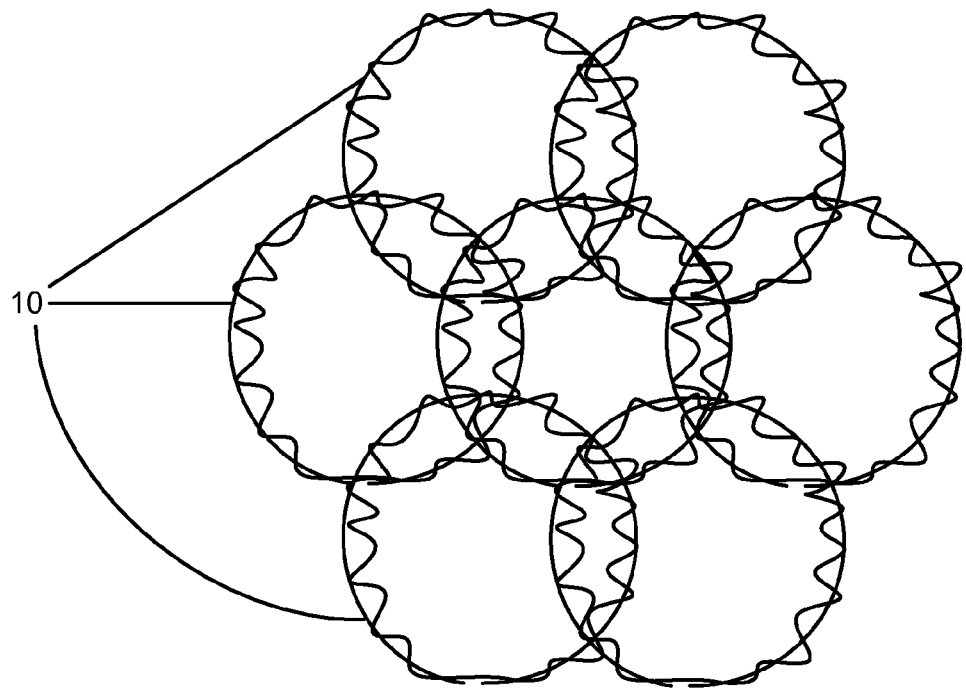

Referring to FIGS. 4a, 4b and FIGS. 5a, 5b, arrays of stacked coils can be coupled together and can be used to cover an extended field of view of the subject. Referring to FIG. 4a, in this configuration, the elements of the array are each formed as stacked or twisted coils of the aforementioned types. The array elements may be all the same size, or the individual coils that comprise the array may be of different sizes, and/or shapes, different orientations relative to one another (due to following the contour of a the surface of a subject), or have a different number of stacked or twisted conductive elements in accordance with a particular application. A breast coil, as in FIG. 4b for example, may have large axilla coil elements of a rectangular shape (not shown), and may also have circular coil elements which may be of varying diameter providing coverage for the rest of the organ. In this breast coil configuration as depicted in FIG. 4b, the entire array may conform to the organ as with a brassiere.

In some array configurations, the elements of an array of twisted coils of the type depicted in FIG. 2a, can be interwoven in their shared region. That is, the twisted conductors of each coil 10 element can be twisted or braided together (although the conductors are still electrically isolated from one another and may include separate blocking networks 21) to form a single element at their shared region.

Figure 5A:
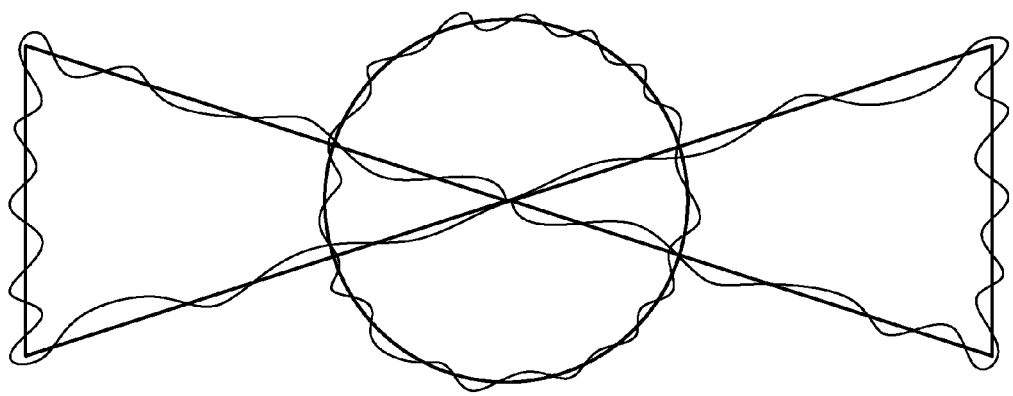
FIGS. 5a and 5b are plan views of a quadrature configuration of stacked elements in accordance with the present invention.
Figure 5B:
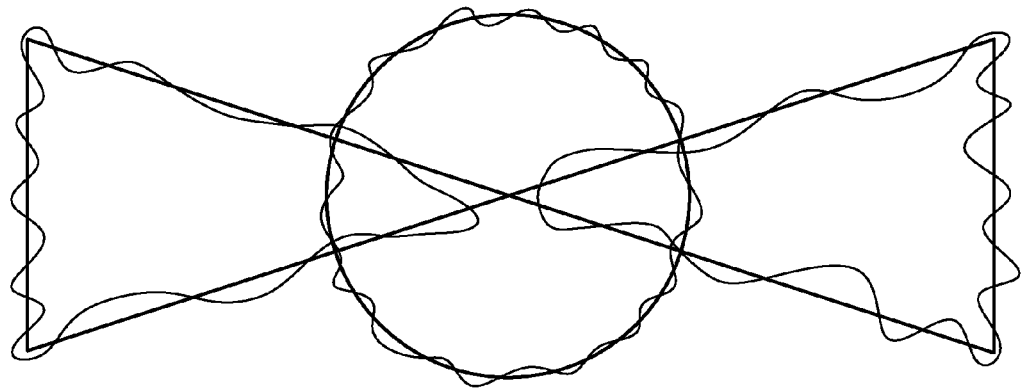

Referring to FIGS. 5a and 5b, arrays of stacked coils can be coupled together to form a quadrature or "butterfly" coil, which can be utilized, for example, in a spine coil. The stacked coil depicted by FIG. 5a, has both a stacked circular center element, coupled with a stacked butterfly element. The stacked coil depicted by FIG. 5b has a stacked circular center element, coupled with a butterfly element where each half of the butterfly has a second conductive element forming two stacked halves of the commonly shared butterfly element. It will be appreciated that a number of these coils can be used together to form a quadrature spine coil and the like.

The coil configurations of the present invention may be utilized in MRI, MR spectroscopy, and the like. Additionally, various coil shapes may be utilized, including circular loops, square loops, rectangular loops, fractal shapes, and the like. Accordingly, it will be readily understood by those persons skilled in the art that, in view of the above detailed description of the invention, the present invention is susceptible of broad utility and application. Many adaptations of the present invention other than those herein described, as well as many variations, modifications, and equivalent arrangements will be apparent from or reasonably suggested by the present invention and the above detailed description thereof, without departing from the substance or scope of the present invention.

It should also be readily understood that the figures are meant for illustrative purposes only, and that the twisted or stacked configurations are readily interchangeable for any desired coil configuration, and the twisted and stacked configurations may both be utilized within the same coil array. Also, the present invention has been described in terms of one or more preferred embodiments, and it should be appreciated that many equivalents, alternatives, variations, and modifications, aside from those expressly stated, are possible and within the scope of the invention.

The invention claimed is:

1. A radio frequency (RF) coil for use with a magnetic resonance system, comprising:
    an insulating layer extending from a top surface to a bottom surface to define a thickness of the insulating layer;
    a first conductor element alternating between the top surface of the insulating layer and the bottom surface of the insulating layer;
    a second conductor element that is electrically independent from the first conductor element and alternating between the top surface of the insulating layer and the bottom surface of the insulating layer;
    a plurality of vias, each of the plurality of vias extending through the insulating layer from the top surface to the bottom surface; and
    wherein the first conductor element alternates between the top surface of the insulating layer and the bottom surface of the insulating layer while the second conductor element respectively alternates between the bottom surface and the top surface of the insulating layer at each of the plurality of vias such that the first conductor element and the second conductor element share a substantially similar field-of-view.

2. The RF coil as recited in claim 1 further comprising an electrical connector for coupling the first conductor and the second conductor elements to a magnetic resonance system, in which the electrical connector is configured such that each of the first and second conductor elements are individually coupled to the magnetic resonance system.

3. The RF coil as recited in claim 1 in which the first conductor element is tuned to a first resonance frequency and the second conductor element is tuned to a second resonance frequency.

4. The RF coil as recited in claim 1 in which the insulating layer is a printed circuit board and the first conductor and the second conductor comprise traces on the printed circuit board.

5. The RF coil as recited in claim 1 in which the insulating layer is a printed circuit board and the first conductor element and the second conductor element comprise traces on the printed circuit board.

6. The RF coil as recited in claim 1 in which the thickness of the insulating layer defines an inductive coupling between the first conductor element and the second conductor element.

7. The RF coil as recited in claim 1 in which the thickness of the insulating layer is selected based on a magnetic field strength of the magnetic resonance system for which the RF coil will be used.

8. The RF coil as recited in claim 7 in which the thickness of the insulating layer is less than about 10 mil for a magnetic field strength of 1.5 Tesla.

9. The RF coil as recited in claim 7 in which the thickness of the insulating layer is in a range of about 10 mil to about 45 mil for a magnetic field strength of 3 Tesla.

\* \* \* \* \*